(12) United States Patent
Jung et al.

(10) Patent No.: US 7,056,803 B2
(45) Date of Patent: Jun. 6, 2006

(54) METHOD FOR FORMING CAPACITOR OF SEMICONDUCTOR DEVICE

(75) Inventors: Jong Goo Jung, Suwon-si (KR); Hyung Soon Park, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,508

(22) Filed: Jun. 30, 2004

(65) Prior Publication Data
US 2005/0136590 A1    Jun. 23, 2005

(30) Foreign Application Priority Data
Dec. 19, 2003    (KR) .................. 10-2003-0093920

(51) Int. Cl.
*H01L 21/20*    (2006.01)
(52) U.S. Cl. .................. 438/396; 438/253; 438/693; 257/534
(58) Field of Classification Search ............ 438/396, 438/253, 693; 257/534
See application file for complete search history.

(56) References Cited

U.S. PATENT DOCUMENTS

| | | | | |
|---|---|---|---|---|
| 5,270,241 A * | 12/1993 | Dennison et al. | ......... | 438/396 |
| 5,769,689 A * | 6/1998 | Cossaboon et al. | ......... | 451/41 |
| 6,071,802 A | 6/2000 | Ban et al. | | |
| 6,239,032 B1 * | 5/2001 | Nakamura et al. | ......... | 438/693 |
| 6,319,770 B1 | 11/2001 | Lou | | |
| 6,524,167 B1 * | 2/2003 | Tsai et al. | ......... | 451/41 |
| 6,555,433 B1 | 4/2003 | Liaw | | |
| 6,620,366 B1 | 9/2003 | Sagal | | |
| 6,776,696 B1 * | 8/2004 | Mahulikar et al. | ......... | 451/57 |
| 6,884,692 B1 * | 4/2005 | Rhodes et al. | ......... | 438/399 |
| 6,908,812 B1 * | 6/2005 | Lowrey | ......... | 438/253 |
| 2002/0079581 A1 | 6/2002 | Graettinger et al. | | |
| 2002/0197855 A1 * | 12/2002 | Kim et al. | ......... | 438/650 |
| 2003/0013385 A1 * | 1/2003 | Kim et al. | ......... | 451/41 |
| 2003/0013386 A1 * | 1/2003 | Weinstein et al. | ......... | 451/41 |
| 2003/0119324 A1 * | 6/2003 | Jung et al. | ......... | 438/692 |
| 2003/0205748 A1 | 11/2003 | Park | | |
| 2004/0134873 A1 * | 7/2004 | Yao et al. | ......... | 216/2 |

FOREIGN PATENT DOCUMENTS

| | | |
|---|---|---|
| JP | 02-103961 | 4/1990 |
| JP | 10-321814 | 12/1998 |
| KR | 1020020043912 A | 6/2002 |
| KR | 1020020058573 A | 7/2002 |

* cited by examiner

*Primary Examiner*—Bradley K. Smith
*Assistant Examiner*—Steven J Fulk
(74) *Attorney, Agent, or Firm*—Heller Ehrman LLP

(57) ABSTRACT

Disclosed is a method for forming a capacitor of a semiconductor device. The method comprises the steps of: forming a nitride film for storage electrode on a semiconductor substrate; forming an oxide film for storage electrode on the nitride film; selectively etching the oxide film and the nitride film to define a storage electrode region; forming a conductive layer for storage electrode on the semiconductor substrate including the storage electrode region; forming a gap-filling nitride film on the semiconductor substrate to fill up the storage electrode region; performing a CMP process using the oxide film as a polishing stop layer to form a storage electrode; and removing the gap-filling nitride film.

15 Claims, 18 Drawing Sheets

METHOD FOR FORMING CAPACITOR OF SEMICONDUCTOR DEVICE

BACKGROUND OF THE INVENTION

1. Field of the Invention

The present invention generally relates to a method for forming a capacitor of a semiconductor device, and more specifically, to a method for forming a capacitor which prevents CMP by-products from flowing the inside of the capacitor during a CMP process for separating a storage electrode when the capacitor is formed.

2. Description of the Prior Art

FIGS. 1a to 1h are cross-sectional diagrams illustrating a conventional method for forming a capacitor of a semiconductor device.

Referring to FIG. 1a, a stacked pattern of a bitline 12 and a hard mask film 14 is formed on a semiconductor substrate 10.

Thereafter, a nitride film or an oxide film (not shown) is formed on the entire surface of the resulting structure, and spacers 16 are formed on sidewalls of the stacked pattern of the bitline 12 and the hard mask film 14 by blanket-etching the nitride film or the oxide film.

Next, a plug material is deposited on the entire surface of the resulting structure, and a storage electrode contact plug 18 is formed by planarizing the plug material. Then, a $Si_3N_4$ film or a SiON film is deposited on the entire surface of the resulting structure to form a nitride film for storage electrode 20.

Referring to FIG. 1b, an oxide film for storage electrode 22 is formed on the nitride film for storage electrode 20.

Referring to FIG. 1c, a storage electrode hard mask film 24 is formed on the oxide film for storage electrode 22.

After a photoresist film (not shown) is deposited on the storage electrode hard mask film 24, the photoresist film is selectively exposed and developed to form a photoresist film pattern 26.

Next, a pattern of the storage electrode hard mask film 24 is formed by selectively etching the lower storage electrode hard mask film 24 using the photoresist film pattern 26 as an etching mask. Then, a pattern of the oxide film for storage electrode 22 is formed by selectively etching the lower oxide film for storage electrode 22 using the pattern of the storage electrode hard mask film 24 as an etching mask.

Referring to FIG. 1d, a pattern of the nitride film for storage electrode 20 is formed by selectively etching the lower nitride film for storage electrode 20 using the pattern of the oxide film for storage electrode as an etching mask, thereby defining a storage electrode region.

The initial thickness of the oxide film for storage electrode 22 is t1 as shown in FIG. 1c. However, the thickness of the oxide film for storage electrode 22 (t2) after the etching process becomes shorter ranging from 100 to 800 Å than the thickness t1 since it is used as the etching mask during the etching process of the nitride film for storage electrode 20.

Referring to FIG. 1e, a polysilicon film is deposited on the entire surface of the resulting structure to form a conductive layer for storage electrode 28.

Referring to FIG. 1f, a gap-filling photoresist film 30 is formed on the entire surface of the resulting structure.

Referring to FIG. 1g, a CMP process is performed on the conductive layer for storage electrode 28 and the gap-filling photoresist film 30 using the oxide film for storage electrode 22 as a polishing stop layer, thereby forming a storage electrode 32.

As a result, photoresist materials for forming the photoresist film 30, CMP slurry residuals and foreign substances (represented by "D") which are reactants of polysilicon for forming the storage electrode 32 are deposited on the gap-filling photoresist film 30 or the storage electrode 32 in the capacitor by the CMP process.

The photoresist materials which are removed by the CMP process contaminate CMP equipment, and the CMP process performed by the contaminated CMP equipment reduces yield of devices and degrades efficiency of the equipment.

FIG. 2 is a CD SEM plane photograph illustrating the result of FIG. 1g. FIG. 2 shows that the foreign substances D which are generated after the CMP process exist on the gap-filling photoresist film 30 in the capacitor or on the boundary surface of the photoresist film 30 and the storage electrode 32.

Referring to FIG. 1h, the gap-filling photoresist film 30 which remain on the resulting surface is removed by using mixture solution of $H_2SO_4$ and $H_2O_2$. Here, the foreign substance D which remain on the gap-filling photoresist film 30 in the capacitor is easily removed, but the foreign substance D deposited on the storage electrode 32 is not easily removed by a cleaning process, which causes fail of devices and degrades yield.

SUMMARY OF THE INVENTION

Accordingly, it is an object of the present invention to provide a method for forming a capacitor of a semiconductor device by depositing not a photoresist film but a nitride film to prevent CMP by-products from flowing the inside the capacitor when a storage electrode is deposited and then a CMP process for separating the storage electrode is performed.

In an embodiment, there is provided a method for forming a capacitor of a semiconductor device. The method comprises the steps of:

(a) forming a nitride film for storage electrode on a semiconductor substrate;

(b) forming an oxide film for storage electrode on the nitride film;

(c) selectively etching the oxide film and the nitride film to define a storage electrode region;

(d) forming a conductive layer for storage electrode on the semiconductor substrate including the storage electrode region;

(e) forming a gap-filling nitride film on the semiconductor substrate to fill up the storage electrode region;

(f) performing a CMP process using the oxide film as a polishing stop layer to form a storage electrode; and (g) removing the gap-filling nitride film.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

FIGS. 3a to 3h are cross-sectional diagrams illustrating a method for forming a capacitor of a semiconductor device according to an embodiment of the present invention.

Figure 1A:
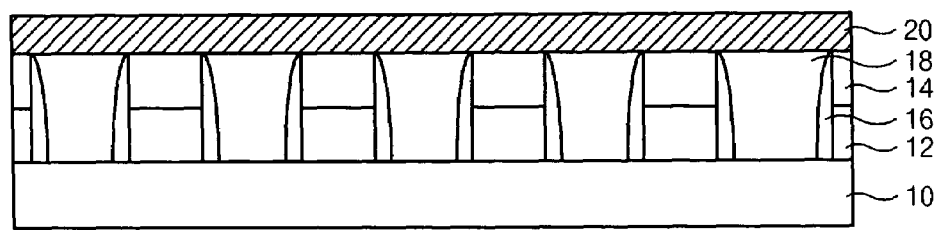
FIGS. 1a to 1h are cross-sectional diagrams illustrating a conventional method for forming a capacitor of a semiconductor device.
Figure 1B:
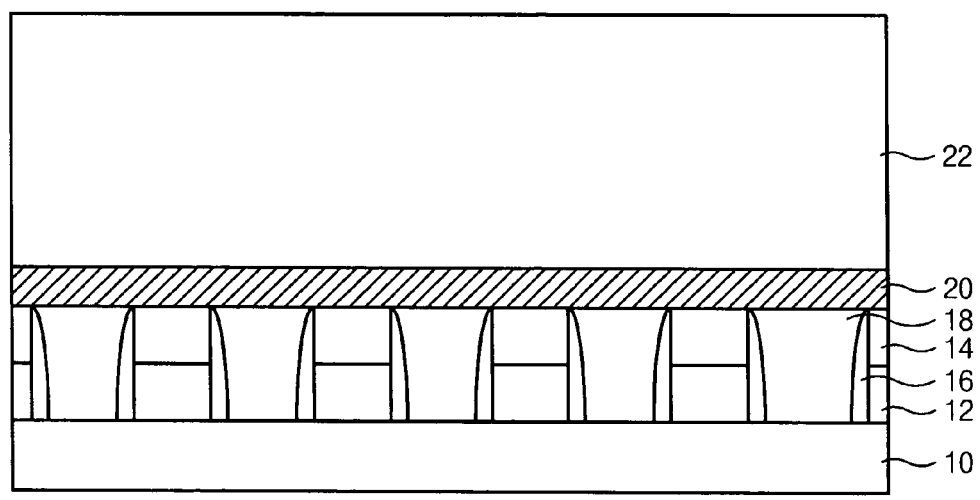
Figure 1C:
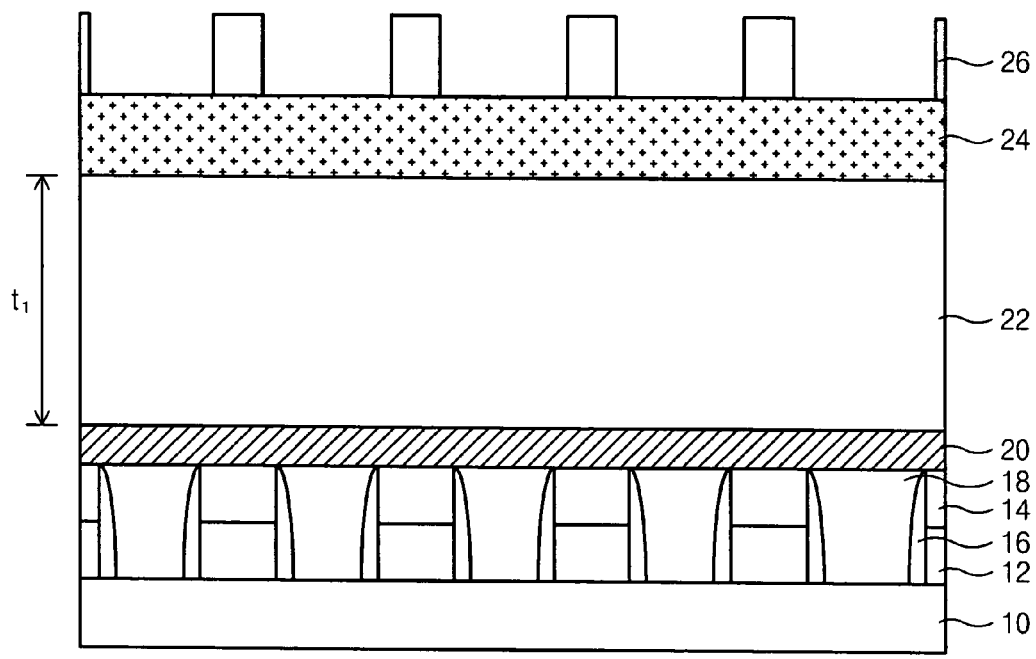
Figure 1D:
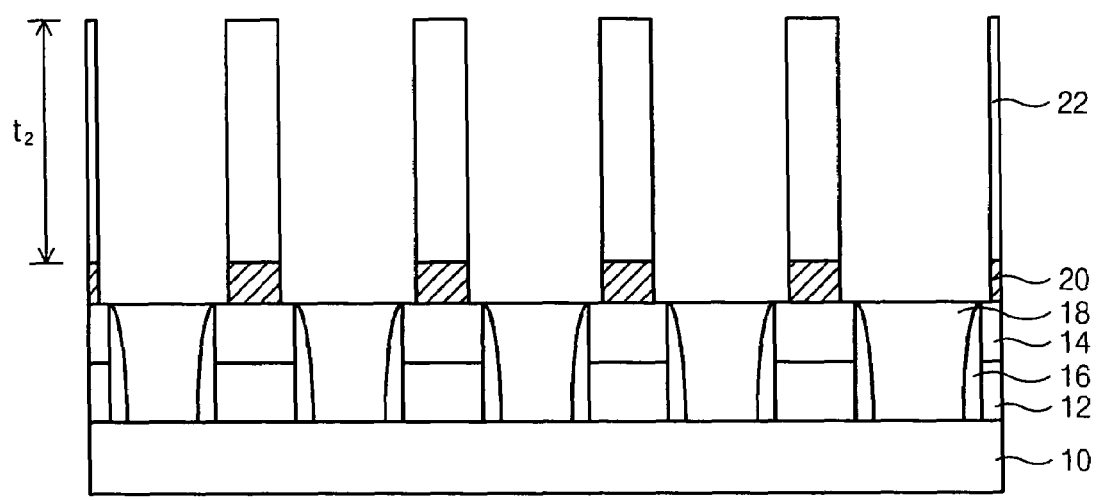
Figure 1E:
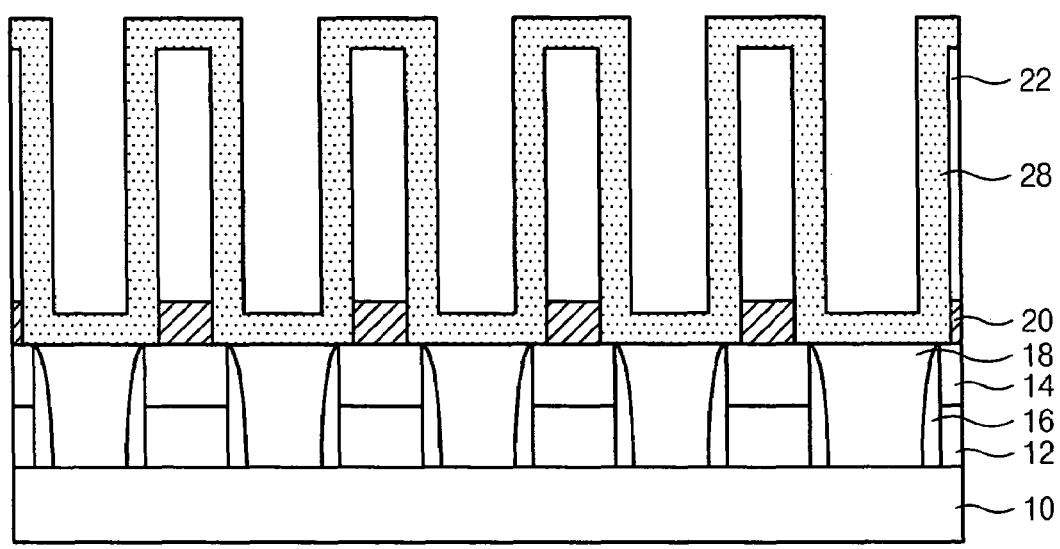
Figure 1F:
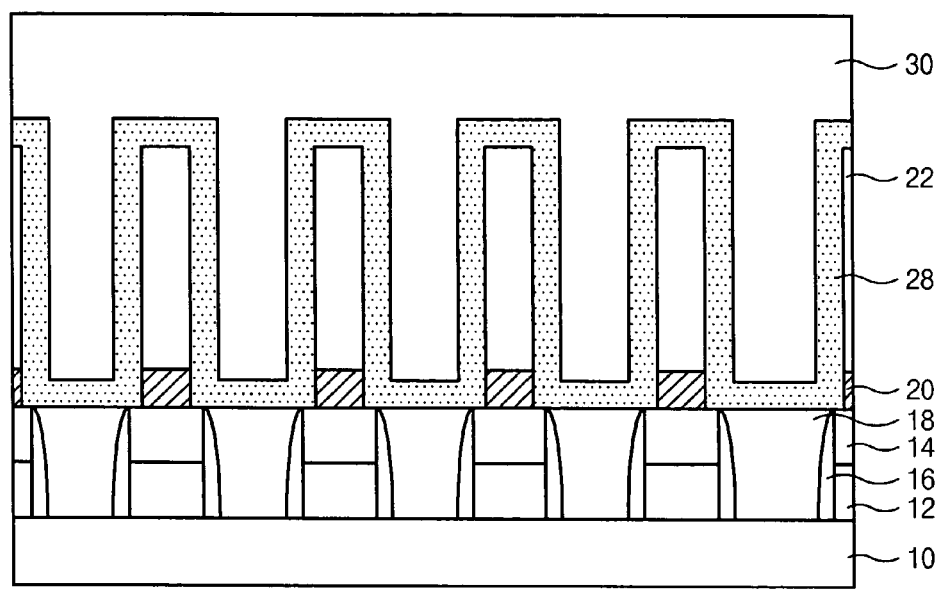
Figure 1G:
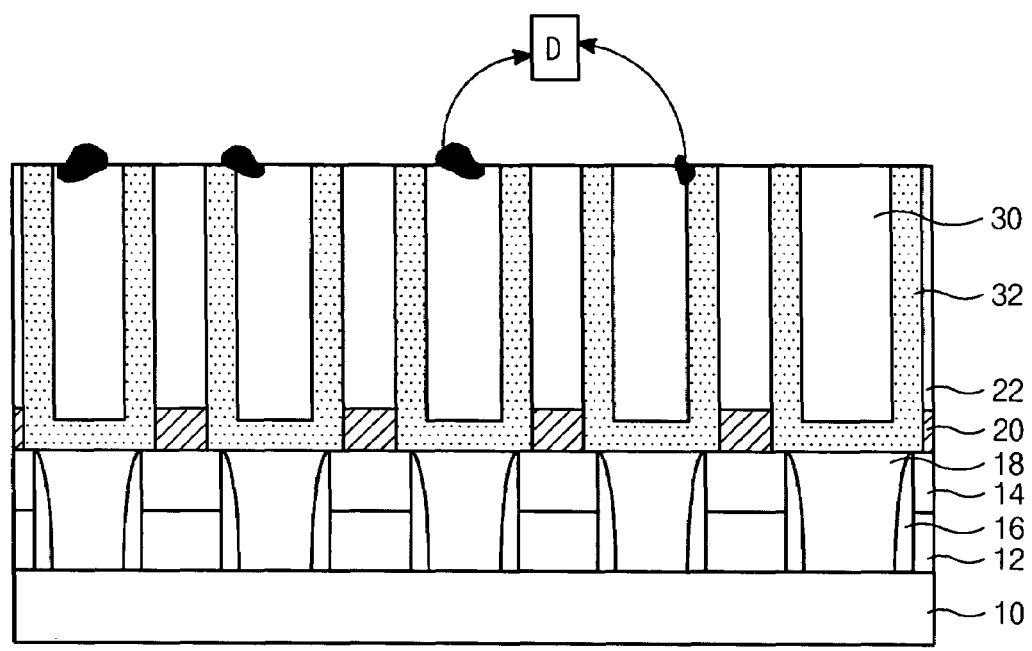
Figure 1H:
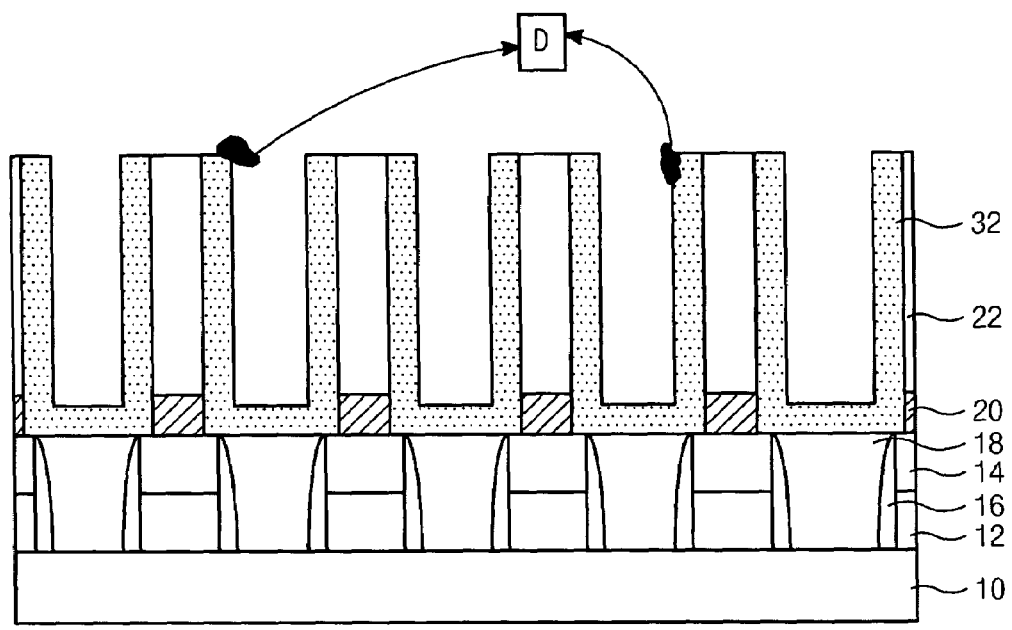
Figure 2:
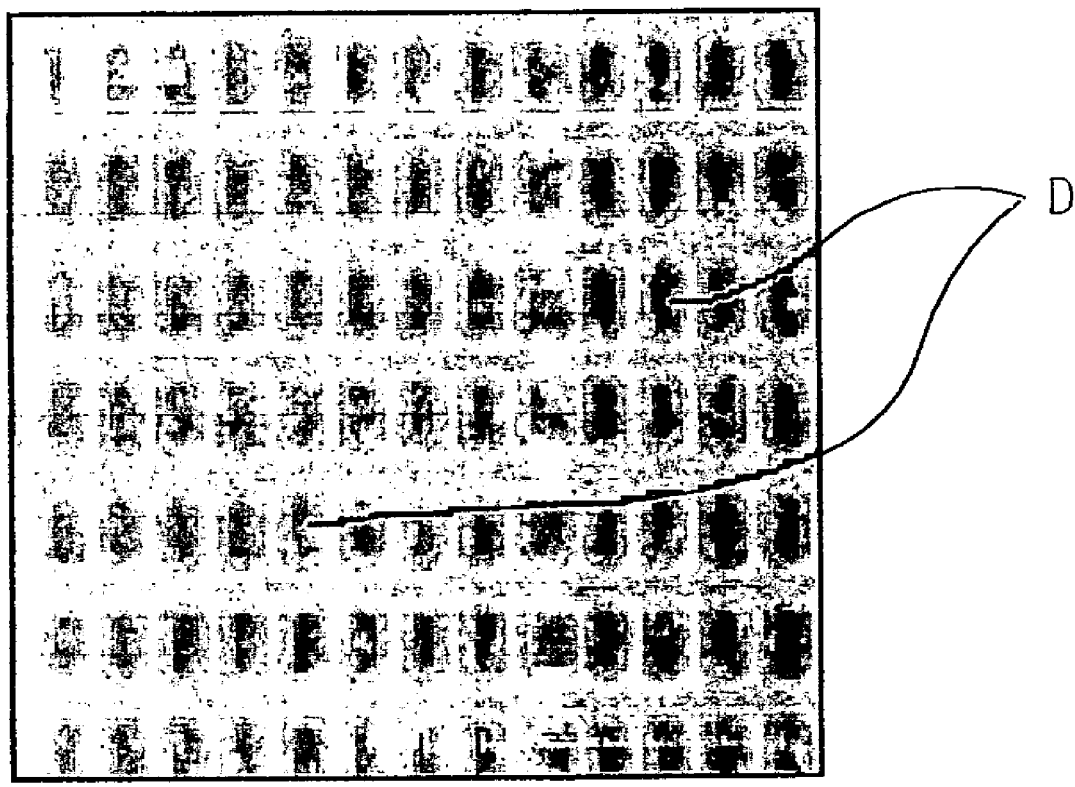
FIG. 2 is a CD SEM plane photograph illustrating the result of FIG. 1g.
Figure 3A:
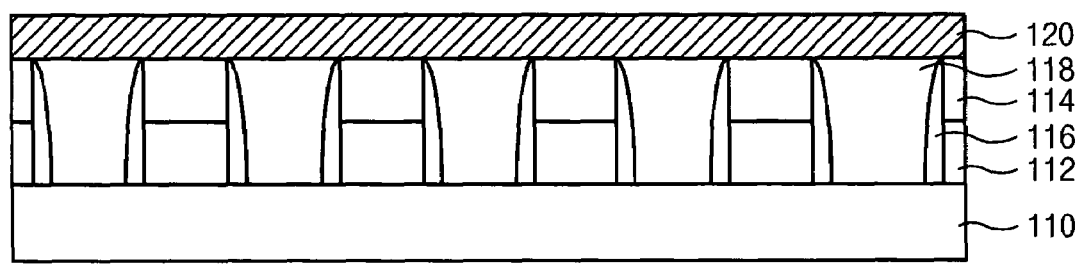
FIGS. 3a to 3h are cross-sectional diagrams illustrating a method for forming a capacitor of a semiconductor device according to an embodiment of the present invention.

Referring to FIG. 3a, a stacked pattern of a bitline 112 and a hard mask film 114 is formed on a semiconductor substrate 110.

Thereafter, a nitride film or an oxide film (not shown) is formed on the entire surface of the resulting structure, and spacers 116 are formed on sidewalls of the stacked pattern of the bitline 112 and the hard mask film 114 by blanket-etching the nitride film or the oxide film.

Next, a plug material (not shown) is deposited on the entire surface of the resulting structure, and a storage electrode contact plug 118 is formed by planarizing the plug material.

Then, a nitride film for storage electrode 120 is formed on the entire surface of the resulting structure at a thickness ranging from 200 to 3000 Å, preferably from 500 to 1000 Å.

Preferably, the nitride film for storage electrode 120 is a $Si_3N_4$ film formed via a low pressure chemical vapor deposition (LPCVD) method using $SiH_2Cl_2$ and $NH_3$ as a source or via a plasma enhanced chemical vapor deposition (PECVD) method using $SiH_4$ and $NH_3$ as a source. Additionally, the nitride film for storage electrode 120 is a SiON film formed via a PECVD method using $SiH_4$ and $N_2O$ as a source.

Figure 3B:
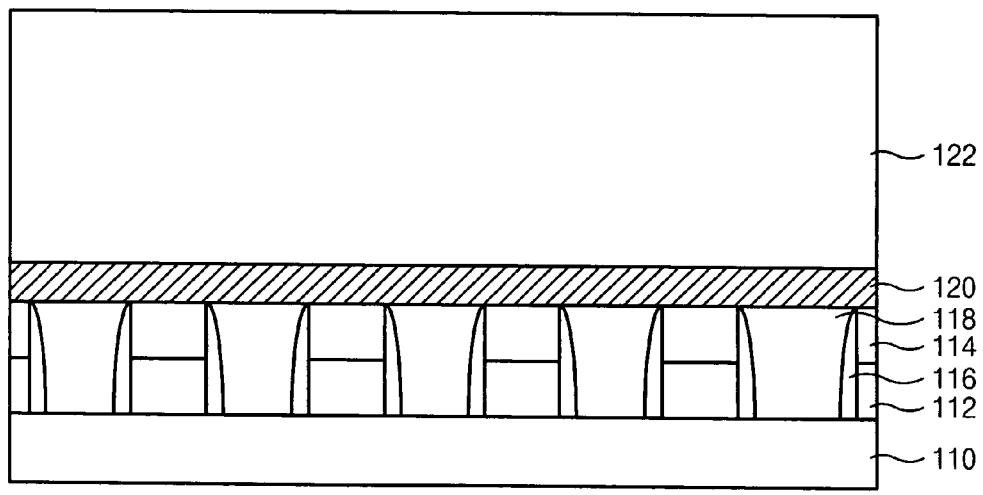

Referring to FIG. 3b, an oxide film for storage electrode 122 is formed on the nitride film for storage electrode 120 at a thickness ranging from 10000 to 30000 Å, preferably from 15000 to 25000 Å.

Preferably, the oxide film for storage electrode 122 is selected from a group consisting of a PE-TEOS (plasma enhanced tetraethyl ortho silicate) oxide film, an $O_3$-TEOS ($O_3$-tetraethyl ortho silicate) oxide film, a BPSG (boron phosphorous silicate glass) oxide film, a PSG (phosphorous silicate glass) oxide film, an APL (advanced planarization layer) oxide film having fluidity, an ALD (atomic layer deposition) oxide film and a SOG (spin on glass) oxide film. The APL oxide film is formed via a LPCVD method using $H_2O_2$ and $SiH_4$ as a reaction source.

Thereafter, a subsequent thermal processing is performed in an atmosphere of $H_2$ gas, $O_2$ gas, $O_3$ gas or $H_2/O_2$ mixed gas at a temperature ranging from 500 to 1200° C. for 5~40 minutes. Otherwise, a rapid thermal process (hereinafter, referred to as "RTP") is performed at a temperature ranging from 600 to 1000° C. for 5~20 seconds. As a result, the quality of the oxide film for storage electrode 122 becomes dense.

Figure 3C:
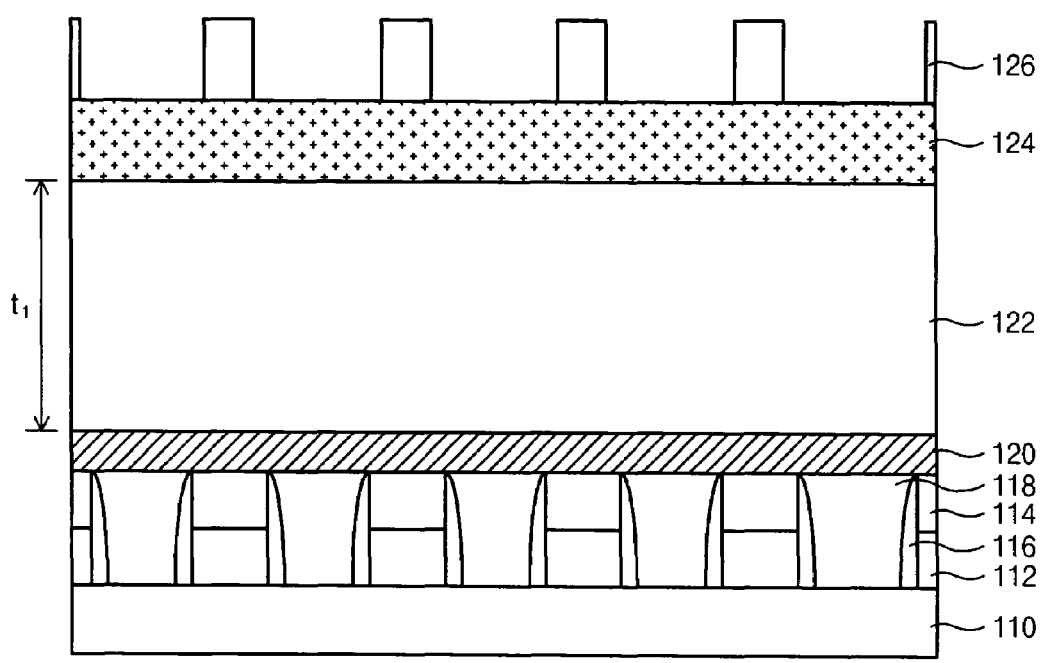

Referring to FIG. 3c, a storage electrode hard mask film 124 is formed on the oxide film for storage electrode 122 at a thickness ranging from 500 to 10000 Å, preferably to 2000 to 5000 Å.

Here, the storage electrode hard mask film 124 is an undoped polysilicon film formed using $SiH_2Cl_2$ or $SiH_4$ as a source; or a doped polysilicon film obtained by implanting impurities such as B, P or As in the undoped polysilicon film at a temperature ranging from 300 to 1000° C., preferably from 400 to 700° C.

Preferably, the doped polysilicon film is formed via an in-situ doping method or an ion-implant process.

Next, a photoresist film (not shown) is deposited on the storage electrode hard mask film 124, and a photoresist film pattern 126 which defines a storage electrode region is formed on the storage electrode hard mask film 124 by selectively exposing and developing the photoresist film.

Thereafter, a pattern of the storage electrode hard mask film 124 is formed by selectively etching the lower storage electrode hard mask film 124 using the photoresist film pattern 126 as an etching mask, and a pattern of the oxide film for storage electrode 122 is formed by selectively etching the lower oxide film for storage electrode 122 using the pattern of the storage electrode hard mask film 124 as an etching mask.

The oxide film for storage electrode 122 is etched by using one or more gases selected from $C_4F_6$, $CF_4$, $C_2F_6$ and $C_3F_8$. A dry etching process is preferably performed by additionally using $O_2$ gas to improve the etching speed of the oxide film. Here, the nitride film for storage electrode 120 formed under the oxide film for storage electrode 122 is used as an etch stop layer.

Figure 3D:
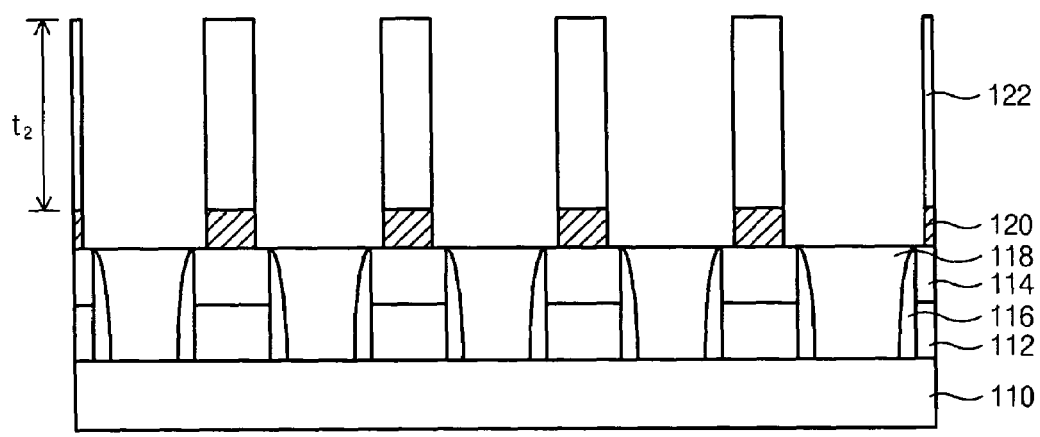

Referring to FIG. 3d, a pattern of the nitride film for storage electrode 120 is formed by selectively etching the lower nitride film for storage electrode 120 using the pattern of the oxide film for storage electrode 122 as an etching mask by using $SF_6$ gas or mixture gas of $CHF_3/CF_4$, thereby defining a storage electrode region.

The initial thickness of the oxide film for storage electrode 122 is t1 as shown in FIG. 3c. However, the thickness of the oxide film for storage electrode 122 (t2) after the etching process becomes shorter ranging from 100 to 800 Å than the thickness t1 since it is used as the etching mask during the etching process of the nitride film for storage electrode 120.

Figure 3E:
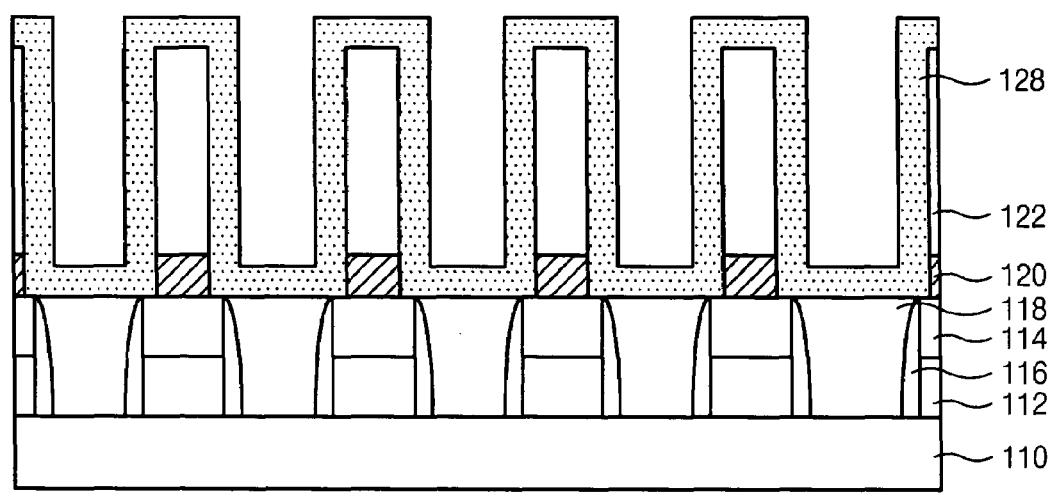

Referring to FIG. 3e, a conductive layer for storage electrode 128 is formed on the entire surface of the resulting structure at a thickness ranging from 100 to 1000 Å, preferably from 200 to 600 Å.

Here, the conductive layer for storage electrode 128 is an undoped polysilicon film formed using $SiH_2Cl_2$ or $SiH_4$ as a source; or a doped polysilicon film obtained by implanting impurities such as B, P or As in the undoped polysilicon film at a temperature ranging from 300 to 1000° C., preferably from 400 to 700° C.

Preferably, the doped polysilicon film is formed via an in-situ doping method or an ion-implant process.

Figure 3F:
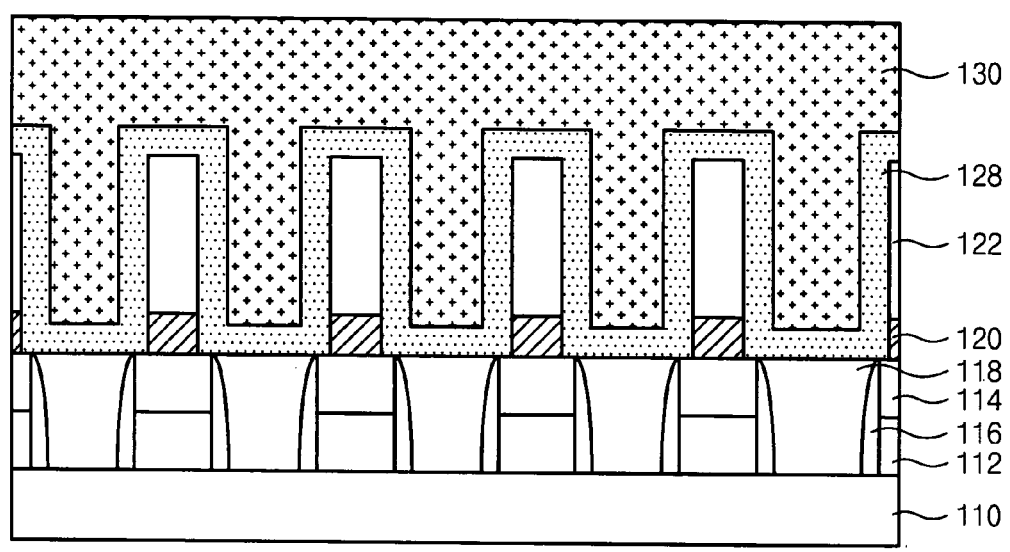

Referring to FIG. 3f, a gap-filling nitride film 130 is formed on the entire surface of the resulting structure at a thickness ranging from 100 to 4000 Å, preferably from 200 to 1000 Å.

Here, the gap-filling nitride film 130 is preferably a $Si_3N_4$ film formed via a LPCVD method using $SiH_2Cl_2$ and $NH_3$ as a source or via a PECVD method using $SiH_4$ and $NH_3$ as a source. Additionally, the gap-filling nitride film 130 is a SiON film formed via a PECVD method using $SiH_4$ and $N_2O$ as a source.

Figure 3G:
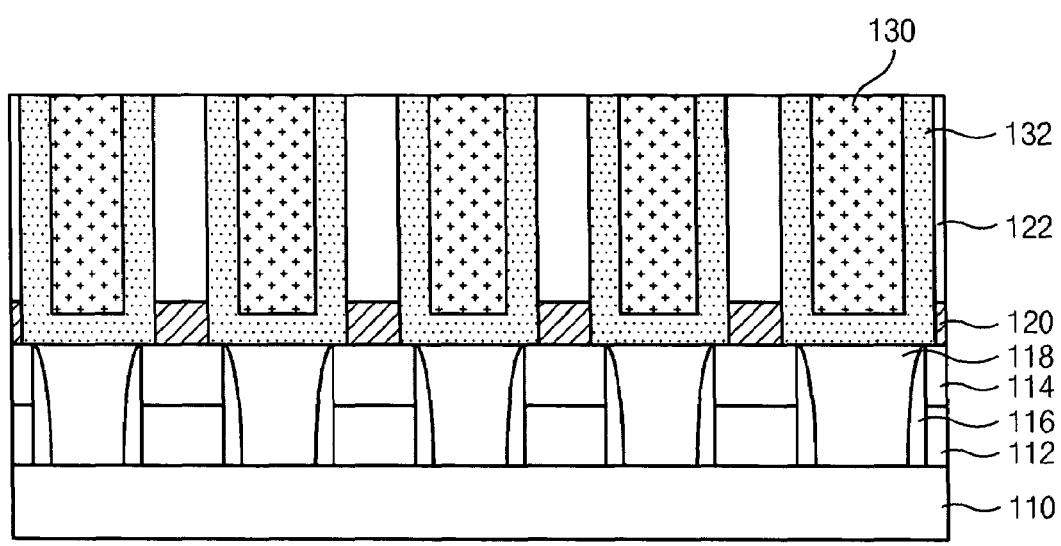

Referring to FIG. 3g, a storage electrode 132 is formed by performing a CMP process on the gap-filling nitride film 130 and the conductive layer for storage electrode 128 using the oxide film for storage electrode 122 on the nitride film for storage electrode 120 as a polishing stop layer.

The CMP process is performed using a slurry having a pH ranging from 2 to 12, preferably from 2 to 8, comprising 0.5~10 wt % of an abrasive having a particle size ranging from 50 to 500 nm, 0.01~30 wt %, preferably 0.1~10 wt % of a phosphoric acid type compound, 0.01~30 wt %, preferably 0.1~10 wt % of an oxidizer and 0.01~10 wt % of a pH control agent.

Here the CMP process is performed under conditions of: a polishing pressure ranging from 1 to 10 psi, preferably from 3 to 6 psi, a head revolution ranging from 10 to 200 rpm (revolutions per minute), preferably from 30 to 90 rpm, a table revolution ranging from 10 to 200 rpm, preferably from 30 to 90 rpm in a rotary type equipment, and a table linear movement speed ranging from 150 to 1000 fpm (feet per minute), preferably from 200 to 600 fpm in a linear equipment, and at a flow rate of the slurry ranging from 50 to 500 mL/min, preferably from 100 to 300 mL/min, using a hard pad.

The slurry comprises a phosphoric acid type compound represented by Formula 1;

  [Formula 1]

where M is one of $H^+$; alkali metal ions including $Na^+$ or $K^+$; alkali earth metal ions including $Mg^{2+}$ or $Ca^{2+}$; and $NH^{4+}$, x is an integer from 0 to 3, y is an integer from 1 to 3, and z is an integer from 2 to 5.

The phosphoric acid type compound improves the polishing speed of the gap-filling nitride film 130. Preferably, $H_3PO_4$ or $NaH_2PO_2$ are used as the phosphoric acid type compound.

Preferably, the abrasive is selected from a group consisting of colloidal $SiO_2$, fumed $SiO_2$, $Al_2O_3$, $CeO_2$, $ZrO_2$ and combinations thereof.

Preferably, the oxidizer which improves the polishing speed of polysilicon, that is, the conductive layer for storage electrode 128, is selected from a group consisting of $H_2O_2$, $H_5IO_6$, $FeNO_3$ and combinations thereof.

Preferably, the pH control agent is an inorganic acid such as hydrochloric acid or nitric acid; or an organic acid such as acetic acid, citric acid, tartaric acid, succinic acid, malic acid, maleic acid, fumaric acid, malonic acid, glycolic acid, oxalic acid or benzoic acid.

As described above, not the conventional photoresist film but the gap-filling nitride film 130 is filled the inside of the capacitor in an embodiment of the present invention. As a result, when the storage electrode 132 is formed by the CMP process, reactants between the CMP slurry and polishing residuals are not generated. Furthermore, since the gap-filling nitride film 130 in the capacitor is a hard film material unlike the conventional photoresist film, foreign substances are not generated on the gap-filling nitride film 130 the inside of the capacitor or on the boundary surface of the gap-filling nitride film 130 and the storage electrode 132.

Figure 4:
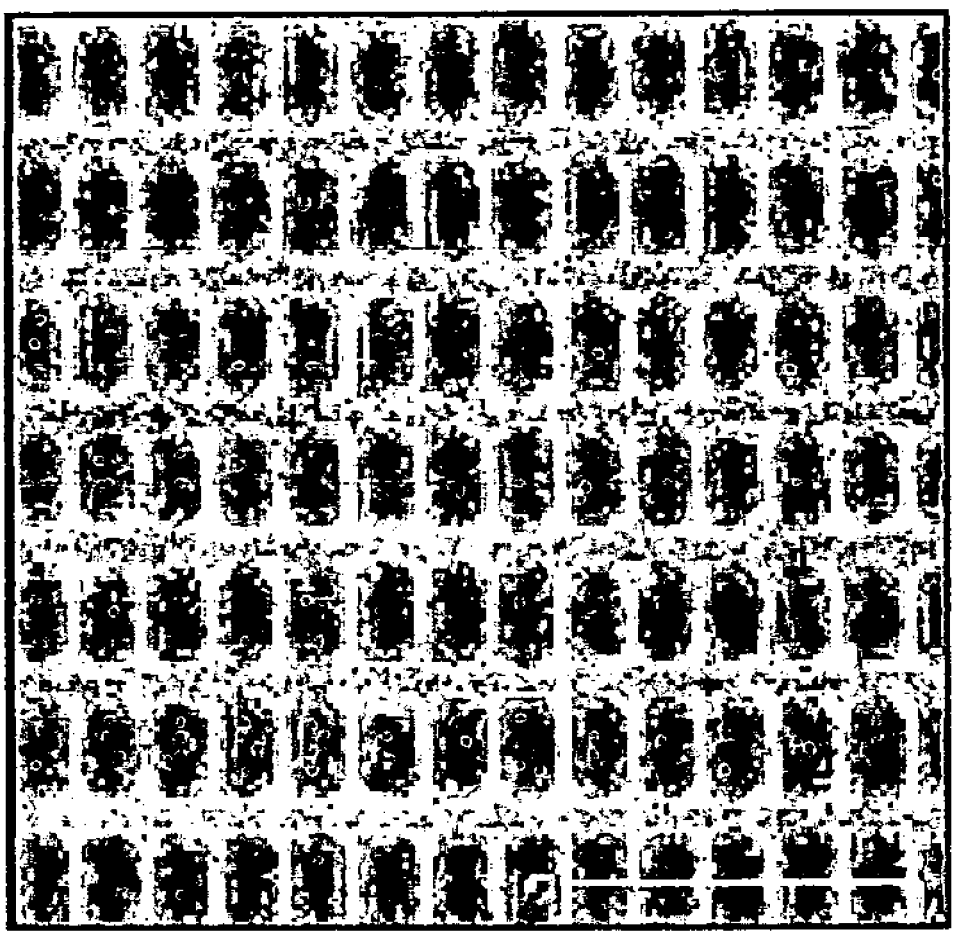
FIG. 4 is a CD SEM plane photograph illustrating the result of FIG. 3g.

FIG. 4 is a CD SEM plane photograph illustrating the result of FIG. 3g. FIG. 4 shows that there is no foreign substance on the gap-filling nitride film 130 in the capacitor or on the boundary surface of the gap-filling nitride film 130 and the storage electrode 132 after the CMP process.

Figure 3H:
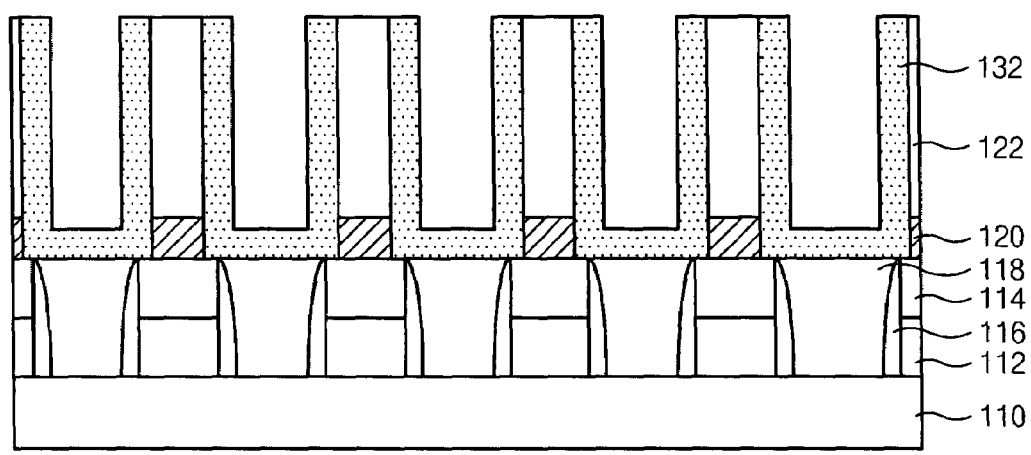

Referring to FIG. 3h, a wet process is performed on the gap-filling nitride film 130 which remains on the resulting structure using $H_3PO_4$ at a temperature ranging from 50 to 300° C., preferably from 100 to 200° C. Here, foreign substances which remain on the gap-filling nitride film 130 in the capacitor are easily removed by the wet process. Meanwhile, a cleaning process may be performed at a relatively low temperature as described above to remove the gap-filling nitride film 130. As a result, thermal budget which results from high temperature or plasma is not generated when the conventional photoresist film.

As discussed earlier, in a method for forming a capacitor of a semiconductor device according to an embodiment of the present invention, not a photoresist film but a gap-filling nitride film is deposited when a storage electrode is deposited and then a CMP process is performed to separate the storage electrode. As a result, foreign substances generated by the CMP process are prevented from flowing the inside the capacitor or from being deposited on the storage electrode. In addition, the gap-filling nitride film is easily removed by a subsequent cleaning process so that the storage electrode of the capacitor is separated without generating foreign substances, thereby preventing fail of devices and improving yield.

What is claimed is:

1. A method for forming a capacitor of a semiconductor device, comprising the steps of:
   (a) forming a nitride film for storage electrode on a semiconductor substrate;
   (b) forming an oxide film for storage electrode on the nitride film, wherein the oxide film for storage electrode is selected from a group consisting of a PE-TEOS (plasma enhanced tetraethyl ortho silicate) oxide film, an $O_3$-TEOS ($O_3$-tetraethyl ortho silicate) oxide film, an APL (advanced planarization layer) oxide film, an ALD (atomic layer deposition) oxide film and a SOG (spin on glass) oxide film;
   (c) selectively etching the oxide film and the nitride film to define a storage electrode region;
   (d) forming a conductive layer for storage electrode on the semiconductor substrate including the storage electrode region;
   (e) forming a gap-filling nitride film on the semiconductor substrate to fill up the storage electrode region;
   (f) performing a CMP process using the oxide film as a polishing stop layer to form a storage electrode, wherein the CMP process is performed using a slurry comprising 0.5~10 wt % of an abrasive having a particle size ranging from 50 to 500 nm, 0.01~30 wt % of $NaH_2PO_2$, 0.01~30 wt % of an oxidizer and 0.01~10 wt % of a pH control agent with its pH ranging from 2 to 12; and
   (g) removing the gap-filling nitride film.

2. The method according to claim 1, wherein the nitride film for storage electrode comprises a $Si_3N_4$ film formed via a low pressure chemical vapor deposition (LPCVD) method using $SiH_2Cl_2$ and $NH_3$ as a source or via a plasma enhanced chemical vapor deposition (PECVD) method using $SiH_4$ and $NH_3$ as a source.

3. The method according to claim 1, wherein the nitride film for storage electrode comprises a SiON film formed via a plasma enhanced chemical vapor deposition (PECVD) method using $SiH_4$ and $N_2O$ as a source.

4. The method according to claim 1, further comprising, after the step (b) and prior to the step (c), a thermal process performed in an atmosphere of $H_2$2 gas, $O_2$ gas, $O_3$ gas or $H_2/O_2$ mixed gas at a temperature ranging from 500 to 1200° C. for 5–40 minutes.

5. The method according to claim 1, further comprising, after the step (b) and prior to the step (c), a rapid thermal process (RTP) performed at a temperature ranging from 600 to 1000° C. for 5–20 seconds.

6. The method according to claim 1, wherein the conductive layer for storage electrode comprises an undoped polysilicon film formed using $SiH_2Cl_2$ or $SiH_4$ as a source, or a doped polysilicon film having an impurity implanted therein.

7. The method according to claim 6, wherein the doped polysilicon film is formed via an in-situ doping method or an ion-implant process.

8. The method according to claim 1, wherein the gap-filling nitride film in the step (e) comprises a $Si_3N_4$ film formed via a low pressure chemical vapor deposition (LPCVD) method using $SiH_2Cl_2$ and $NH_3$ as a source or via a plasma enhanced chemical vapor deposition (PECVD) method using $SiH_4$ and $NH_3$ as a source.

9. The method according to claim 1, wherein the gap-filling nitride film in the step (e) comprises a SiON film formed via a plasma enhanced chemical vapor deposition (PECVD) method using $SiH_4$ and $N_2O$ as a source.

10. The method according to claim 1, wherein the pH of the slurry ranges from 2 to 8.

11. The method according to claim 1, wherein the abrasive is selected from a group consisting of colloidal $SiO_2$, fumed $SiO_2$, $Al_2O_3$, $CeO_2$, $ZrO_2$ and combinations thereof.

12. The method according to claim 1, wherein the oxidizer is selected from a group consisting of $H_2O_2$, $H_5IO_6$, $FeNO_3$ and combinations thereof.

13. The method according to claim 1, wherein the pH control agent is selected from a group consisting of hydrochloric acid, nitric acid, acetic acid, citric acid, tartaric acid, succinic acid, malic acid, maleic acid, fumaric acid, malonic acid, glycolic acid, oxalic acid, benzoic acid and combinations thereof.

14. The method according to claim 1, wherein the CMP process is performed under conditions of: a polishing pressure ranging from 1 to 10 psi, a head revolution ranging from 10 to 200 rpm (revolutions per minute), a table revolution ranging from 10 to 200 rpm or a table linear movement speed ranging from 150 to 1000 fpm (feet per minute) and at a flow rate of the slurry ranging from 50 to 500 mL/min using a hard pad.

15. The method according to claim 1, wherein the step (g) is performed using $H_3PO_4$ at a temperature ranging from 50 to 300° C.

* * * * *